United States Patent [19]

Rossi

[11] Patent Number: 5,266,949
[45] Date of Patent: Nov. 30, 1993

[54] LIGHTED ELECTRONIC KEYBOARD

[75] Inventor: Markku Rossi, Muurla, Finland

[73] Assignee: Nokia Mobile Phones Ltd., Salo, Finland

[21] Appl. No.: 954,465

[22] Filed: Sep. 30, 1992

Related U.S. Application Data

[63] Continuation of Ser. No. 635,346, Dec. 28, 1990, abandoned.

Foreign Application Priority Data

Mar. 29, 1990 [FI] Finland ................. 901585

[51] Int. Cl.⁵ ............................................. H01H 9/00
[52] U.S. Cl. ......................................... 341/22; 341/31; 250/229; 250/227.22; 200/314
[58] Field of Search .............. 341/20; 200/312, 310, 200/311, 313, 314, 315, 316, 317, DIG. 47; 340/711; 250/573, 574, 227.22

[56] References Cited

U.S. PATENT DOCUMENTS

| | | | |
|---|---|---|---|
| 4,049,964 | 9/1977 | Wuchinich et al. | 341/31 |
| 4,303,856 | 12/1981 | Serras-Paulet | 250/229 |
| 4,315,147 | 2/1982 | Harmer | 250/229 |
| 4,931,794 | 6/1990 | Haag et al. | 341/31 |

*Primary Examiner*—John K. Peng
*Assistant Examiner*—Robert Gray
*Attorney, Agent, or Firm*—Darby & Darby

[57] ABSTRACT

A keyboard mounted in connection with a circuit board (2) includes a light source (3). A key (1) of the keyboard comprises a key cap (4) and a body part (5) located between the key cap (4) and the circuit board (2). The body part (5) diffusively transmits light. The light source (3) is arranged to conduct light into the body part (5) and to illuminate the key (1). A photoelectric member (6) is mounted on the circuit board (2) under the key (1) and at a distance from the light source (3). There is further arranged a light barrier (7) in connection with the circuit board (2) or with which key (1), the barrier is arranged to shield the photoelectric member (6) from the light of the light source (3) coming from the body part (5) when the key is depressed. The decrease in light provides an electric change (1) in the photoelectric member (6) indicating a depression of the key.

11 Claims, 1 Drawing Sheet

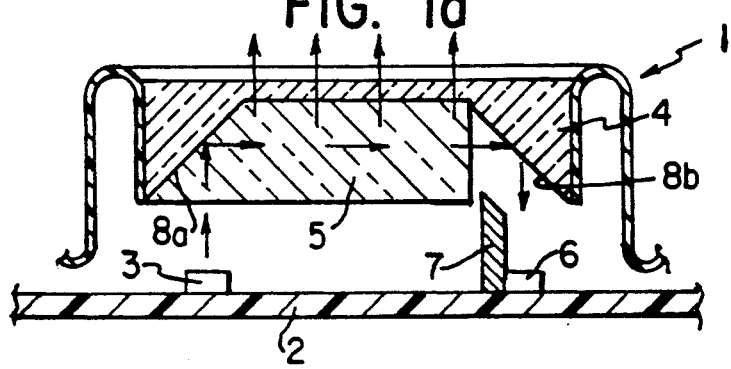
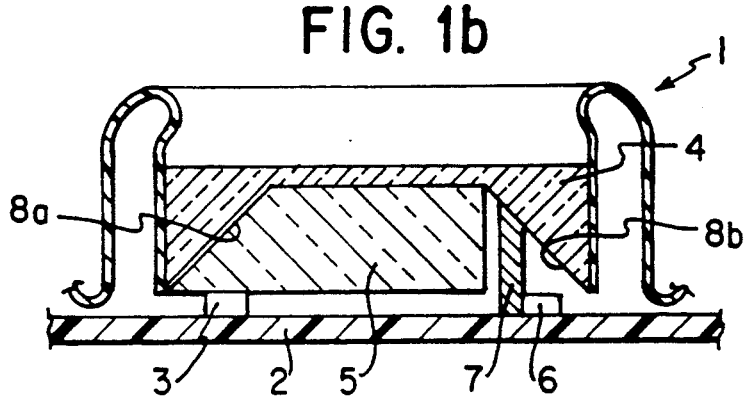
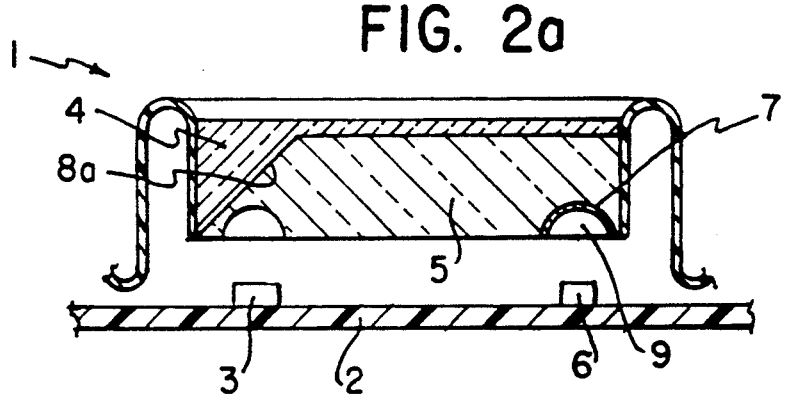
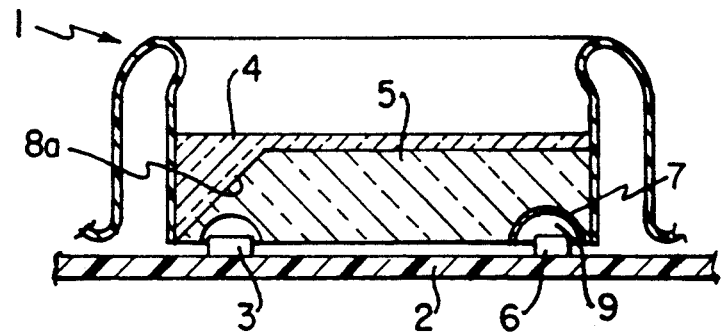

LIGHTED ELECTRONIC KEYBOARD

This is a continuation of application Ser. No. 07/635,346, filed Dec. 28, 1990 now abandoned.

BACKGROUND OF THE INVENTION

The invention relates to a keyboard comprising at least one key mounted in connection with a circuit board and including a light source. The key includes a key cap and, between the key cap and the circuit board, there is a body part that diffusively transmits the light for the key. The light source is arranged to conduct light into the body part and to illuminate the key.

In prior art keys, the key body usually is a molding plastic part with its bottom surface coated with an electrically conducting material. The coating material must be elastic, and its resistance from one edge of the coated area to the other edge has to be between 100 and 1,000 ohms. Such a coating considerably increases the cost of the otherwise cheap molded plastic part, and thus it increases the manufacturing costs of the keyboard.

When the key is depressed, the bottom surface of the body part will hit a contact area comprising two halves on the surface of the circuit board. These halves are also coated with an electrically conducting material. When the bottom surface of the key body part establishes a short circuit between the halves of the contact area, the depression of the key can be electronically detected. The addition of the material of the contact halves decreases the yield of the circuit boards and increases their manufacturing costs. In particular, the alignment difficulties at either end of the keyboard will cause material losses. In addition, the electrical contact is exposed to humidity and chemical aging processes and to rubbish entering the operating device.

The illumination of the key is, according to prior art, realized so that on the surface of the circuit board there are light emitting diodes (LED) illuminating the keyboard. The light is conducted from the LEDs through light conductors to the body part proper and the key. Generally one LED illuminates several keys at the same time, e.g. so that 20 keys are illuminated by 6 LEDs. As a consequence, the luminance of the light will vary from key to key. In addition the luminance value will be low. In prior art arrangement, it is very difficult to realize a light conductor network, which would evenly distribute the light to every key.

SUMMARY OF THE INVENTION

The aim of the invention is to produce a keyboard, which has low manufacturing costs and which functions independently of humidity and other environmental effects. It is a further aim to produce a keyboard with individual keys evenly and sufficiently illuminated. These aims are achieved with a keyboard according to the invention, wherein a photoelectric member is mounted on the circuit board under the key at a distance from the light source, and wherein there is further arranged a light barrier in connection with the circuit board or with the key. The barrier is arranged to shield the photoelectric member from the light of the light source coming from the body part and to produce an electric change in the photoelectric member that indicates a depression of the key.

An embodiment of the invention is further characterized in that the light source is placed on the circuit board under the key and a reflecting surface is arranged above the light source, between the key cap and the body part, so as to reflect light from the light source into the body part.

In a keyboard according to the invention no electrically conducting contact surfaces are required, but the depression of a key is detected through a signal generated by the photoelectric member. Thus the keyboard is functionally reliable, as humidity, dirt and oxidation will not affect the operation of the key. By providing its own light source in every key, the illumination of the keyboard is further increased and at the same time, the illumination will be equally strong in different parts of the keyboard.

BRIEF DESCRIPTION OF THE DRAWINGS

The keyboard according to the invention is explained in more detail below, referring to the enclosed drawing, where FIG. 1a shows in cross-section a keyboard key according to the invention in is upper position;

FIG. 1b shows the key of FIG. 1a in its depressed position;

FIG. 2a shows in cross-section another keyboard key according to the invention in its upper position; and FIG. 2b shows the key of FIG. 2a in its depressed position.

DETAILED DESCRIPTION OF THE PREFERRED EMBODIMENT

A keyboard key according to the invention is shown in FIG. 1. The keyboard comprises at least one such key 1 is mounted in connection with a circuit board 2. On the circuit board there is a light source 3, that can be common to several keys. The light from the light source 3 is conducted to every key, e.g. via a light conductor.

In the case of FIG. 1a a separate light source is assigned to every key. As a light source it is possible to use a surface mounted light emitting diode (LED). The light source 3 is arranged to conduct the light into the body part 5 and to illuminate the key 1. The key 1 is illuminated, partly to make the symbol of the key clearly visible also in daylight.

The key 1 comprises a key cap 4, and between the key cap 4 and the circuit board 2, there is a body part 5, for diffusively transmitting light from the light source 3.

The purpose of the key cap 4 is to cover the key 1. Generally the center of the key cap 4 is provided with a transparent spot, through which the illuminated body part 5 and the key symbol are visible. The key symbol is not represented in the figure.

The key body 5 is, e.g., a plastic part produced by molding. The body part is diffusively transparent. This implies that when the light travels through the material, the light beam scatters into various directions and this results in the illumination of the whole part.

Below the key 1 on the circuit board, at a distance from the light source, there is further arranged a photoelectric member 6. This member 6 can be, e.g., a surface mounted phototransistor. The purpose of the photoelectric member 6 is to receive light coming from the light source through the body part 5.

A light barrier is further arranged in connection with the circuit board 2 or with the key 1, the barrier being arranged to shield the photoelectric member 6 from the light of the light source 3 arriving from the body part 5. When the light path from the body part 5 to the photoelectric member 6 is hidden, the amount of light received by the photoelectric member 6 decreases and causes a change in the output of the photoelectric member 6. This change is used to indicate a depression of the key. The indication may be realized in many ways using known transistor circuits.

Above the light source 3, between the key cap 4 and the body part 5, there is arranged a, which reflects surface 8 reflecting light from the light source 3 into the body part 5. This reflecting surface 8 is e.g. a mirror surface aluminized on the inclined hem of the key cap or on the inclined top edge of the body part 5. The reflecting surface 8 is intended to direct the light coming from the light source under the reflecting surface in the most effective way possible into the body part 5.

The key 1 shown in FIG. 1 has two reflecting surfaces 8a and 8b. Of these, the reflecting surface 8a reflects the light at a substantially 90° angle from the light source 3 into the body part 5, and the reflecting surface 8b reflects the light at a substantially 90° angle downwards to the photoelectric member 6.

In this case shown in FIG. 1, the light barrier 7 is formed by a substantially vertical plane wall attached to the circuit board, the wall being located between the body part 5 and the second reflecting surface 8b, when the key 1 is in its depressed position (FIG. 1b).

When the key 1 is up according to FIG. 1a, the light path of the light source 3 extends from the light source 3 into the body part 5, and from the body part 5 to the reflecting surface 8b where it is reflected downwards to the photoelectric member 6. When the key 1 is in its depressed position, in accordance with FIG. 1b, the light barrier 7 shields the light path between the body part 5 and the reflecting surface 8b, thus shutting off the light to the photoelectric member 6.

In the case of FIG. 2 the light barrier 7 is formed by a non-transparent shading surface fastened to the lower edge of the body part 5 above the photoelectric member 6. The shading surface could be an area provided with some coating not transparent to light.

In the embodiment shown in FIG. 2, there is formed on the lower edge of the body part 5, above the photoelectric member 6, a hollow 9, preferably in the form of a spherical calotte, so that the photoelectric member 6 is surrounded by the hollow 9 when the key 1 is in its depressed position. The surface of the hollow is non-transparent and forms the above mentioned shading surface.

When the key 1 is in its upper position according to FIG. 2, the light path from of the light source 3 extends from the light source 3 into the body part 5, and from the body parts to the reflecting surface 8 where it is reflected back into the body part 5, which will be illuminated and which at the same time illuminates the photoelectric member 6. When the key 1 is in its depressed position, according to FIG. 2b, the light barrier 7 shields the light path between the body part 5 and the photoelectric member 6.

In the keyboard solution according to the invention it is favorable to use pulsed light. This has the advantage that static light, e.g., daylight, will not interfere with the function of the key. Thus the photoelectric member 6 is arranged to receive intermittent light transmitted by the light source 3. The frequency is thus chosen to be sufficiently high, so that there will not be any substantial changes in the key illumination that can be perceived by the eye.

The invention is not limited to the embodiments described above, but it can be modified within the scop of the enclosed claims.

I claim:

1. A keyboard comprising:
   a circuit board;
   a light source mounted on said circuit board for emitting light;
   at least one depressible key mounted for movement between a rest position and a depressed position, said key having a body part formed of a light diffusing and transmitting material, said body part receiving light directly from said light source, a key cap mounted on said body part, said body part moving concurrently with said key cap when said key is depressed;
   a photoelectric member mounted on said circuit board at a distance from said light source, said photoelectric member producing a change in electrical signal depending on the amount of light reaching said photoelectric member, at least a portion of the light reaching said photoelectric member being diffused through said body part when said key is in said rest position; and
   a light barrier positioned between said light source and said photoelectric member when said key is in the depressed position, said barrier shielding said photoelectric member from the light directly emitted from said light source and from the light diffused through said body part when said key is in the depressed position.

2. A keyboard as set forth in claim 1, wherein said light source is located beneath said key, said keyboard further comprising reflective surface means arranged above said light source and between said key cap and said body part for reflecting light from said light source into said body part.

3. A keyboard as set forth in claim 2, wherein said reflective surface means comprises a first reflecting surface arranged at a first edge of said body part to reflect the light from said light source at a substantially 90° angle into said body part, and a second reflecting surface arranged at a second edge of said body part located opposite said first edge to reflect the light from said body at a substantially 90° angle towards said photoelectric member when the key is in is rest position, said light barrier comprising a substantially vertical wall attached to said circuit board and arranged to be located between said body part and said second reflecting surface when said key is in the depressed position.

4. A keyboard as set forth in claim 2, wherein said light barrier is formed as a non-transparent shading surface at a lower edge of said body part above said photoelectric member, said shading surface being contoured to enclose said photoelectric member when said key is in the depressed position.

5. A keyboard as set forth in claim 4, wherein said non-transparent shading surface is a surface of a recess formed at said lower edge of said body part and surrounding said photoelectric member when said key is in the depressed position.

6. A keyboard as set forth in claim 1, wherein said light source comprises a pulsed light source.

7. A keyboard as set forth in claim 1, wherein said light source comprises a light-emitting diode.

8. A keyboard as set forth in claim 1, wherein said photoelectric member comprises a phototransistor.

9. A keyboard as set forth in claim 1, wherein said key cap has a transparent area providing for visibility of a key symbol of said body part.

10. A keyboard comprising:

a circuit board;

a light source mounted on said circuit board for emitting light;

at least one depressible key mounted for movement between a rest position and a depressed position, said key having a body part formed of a light diffusing and transmitting material, said light source being located beneath said key, said body part receiving light directly from said light source, and a key cap mounted on said body part;

a photoelectric member mounted on said circuit board at a distance from said light source, said photoelectric member producing a change in electrical signal depending on the amount of light reaching it, at least a portion of the light reaching said photoelectric member being diffused through said body part when said key is in said rest position; and a light barrier positioned between said light source and said photoelectric member when said key is in the depressed position, said barrier shielding said photoelectric member from the light directly emitted from said light source and from the light diffused through said body part when said key is in the depressed position;

reflective surface means arranged above said light source and between said key cap and said body part for reflecting light from said light source into said body part, said reflecting surface means including a first reflecting surface arranged at a first edge of said body part to reflect the light from said light source at substantially a 90° angle into said body part, and a second reflecting surface arranged at a second edge of said body part located opposite said first edge to reflect the light from said body at substantially a 90° angle towards said photoelectric member when the key is in its rest position, said light barrier comprising a substantially vertical wall attached to said circuit board and arranged to be located between said body part and said second reflecting surface when said key is in the depressed position.

11. A keyboard comprising:

a circuit board;

a light source mounted on said circuit board for emitting light;

at least one depressible key mounted for movement between a rest position and a depressed position, said key having a body part formed of a light diffusing and transmitting material, said light source being located beneath said key, said body part receiving light directly from said light source, and a key cap mounted on said body part;

a photoelectric member mounted on said circuit board at a distance from said light source, said photoelectric member producing a change in electrical signal depending on the amount of light reaching it, at least a portion of the light reaching said photoelectric member being diffused through said body part when said key is in said rest position; and a light barrier positioned between said light source and said photoelectric member when said key is in the depressed position, said barrier shielding said photoelectric member from light directly emitted from said light source and from light diffused through said body part when said key is in the depressed position, said light barrier being formed as a non-transparent shading surface at a lower edge of said body part above said photoelectric member, said shading surface being a surface of a recess formed at said lower edge of said body part and contoured to surround said photoelectric member when said key is in the depressed position, and reflective surface means arranged above said light source and between said key cap and said body part for reflecting light from said light source into said body part.

* * * * *